(12) United States Patent
Sakamoto et al.

(10) Patent No.: US 10,777,443 B2
(45) Date of Patent: Sep. 15, 2020

(54) IMPRINT APPARATUS, IMPRINTING METHOD, AND METHOD FOR MANUFACTURING ARTICLE

(71) Applicant: CANON KABUSHIKI KAISHA, Tokyo (JP)

(72) Inventors: Eiji Sakamoto, Utsunomiya (JP); Junichi Seki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 64 days.

(21) Appl. No.: 15/442,486

(22) Filed: Feb. 24, 2017

(65) Prior Publication Data

US 2017/0246658 A1   Aug. 31, 2017

(30) Foreign Application Priority Data

Feb. 29, 2016 (JP) ................... 2016-038130

(51) Int. Cl.
*H01L 21/683* (2006.01)
*H01L 21/67* (2006.01)
*G03F 7/00* (2006.01)

(52) U.S. Cl.
CPC ............ *H01L 21/6833* (2013.01); *G03F 7/00* (2013.01); *H01L 21/6715* (2013.01)

(58) Field of Classification Search
CPC ... H01L 21/6715; H01L 21/6833; G03F 7/00; G03F 7/002
See application file for complete search history.

(56) References Cited

U.S. PATENT DOCUMENTS

| | | | | |
|---|---|---|---|---|
| 2002/0179852 | A1* | 12/2002 | Zheng | G03F 7/70925 250/492.1 |
| 2006/0097201 | A1* | 5/2006 | Neerhof | G03F 7/707 250/504 R |
| 2009/0295006 | A1* | 12/2009 | Kawakami | B29C 43/003 264/40.1 |
| 2015/0331337 | A1* | 11/2015 | Sundarrajan | H01L 21/6833 355/72 |

FOREIGN PATENT DOCUMENTS

| | | |
|---|---|---|
| JP | 2005-116823 A | 4/2005 |
| JP | 2011-186006 A | 9/2011 |
| JP | 2012-504336 A | 2/2012 |
| JP | 2014-183069 A | 9/2014 |
| JP | 2015-122373 A | 7/2015 |
| JP | 2015138842 A | 7/2015 |

OTHER PUBLICATIONS

Machine translation of JP 2014-183069, published Sep. 29, 2014, obtained Oct. 12, 2018 (Year: 2014).*

* cited by examiner

*Primary Examiner* — Michael M. Robinson
(74) *Attorney, Agent, or Firm* — Canon U.S.A., Inc., I.P. Division

(57) ABSTRACT

An imprint apparatus for forming a pattern of an imprint material on a mold and a substrate includes a substrate holding unit configured to hold the substrate, and a charging unit configured to charge at least one of a surface of the substrate holding unit on a side facing the mold or a particle existing in the vicinity of the surface to the same polarity as the charge polarity of the mold.

12 Claims, 7 Drawing Sheets

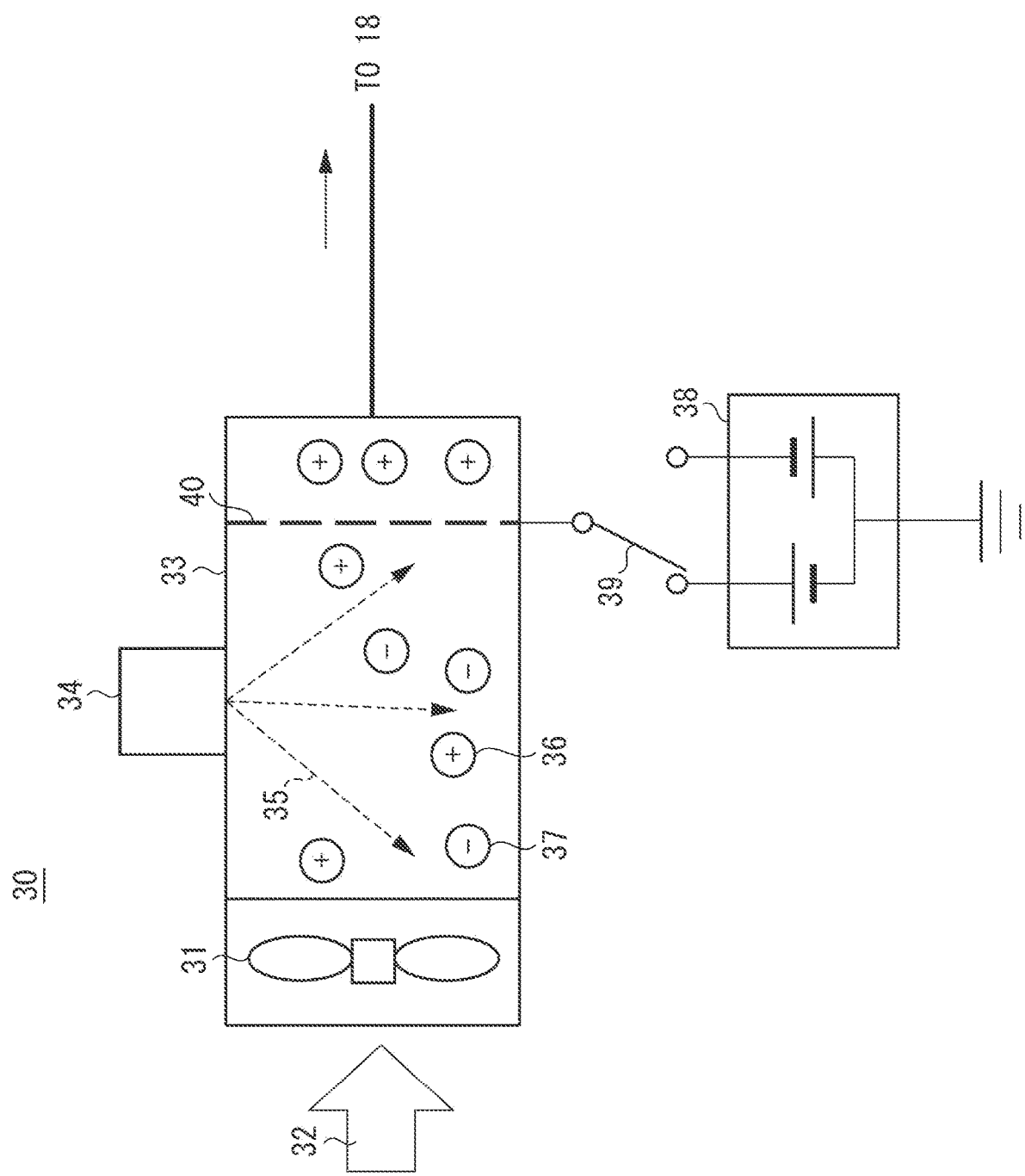

IMPRINT APPARATUS, IMPRINTING METHOD, AND METHOD FOR MANUFACTURING ARTICLE

BACKGROUND OF THE INVENTION

Field of the Invention

The present disclosure relates generally to an imprint apparatus, an imprinting method, and a method for manufacturing articles.

Description of the Related Art

An imprint apparatus is known as an apparatus for forming a minute pattern for manufacturing articles such as semiconductor devices. The imprint apparatus is an apparatus for forming a cured material pattern on which a mold concave-convex pattern is transferred, by applying energy for curing an imprint material thereto, in a state where the imprint material supplied to a region to be processed on a substrate is in contact with a mold.

In the imprint apparatus, when the mold and the imprint material are separated, the mold is charged and charged particles in the atmosphere are likely to adhere to the mold. Sandwiching particles between the mold and the substrate when contacting the imprint material and the mold may cause defects on the cured material pattern to be formed. Japanese Patent Application Laid-Open No. 2014-183069 discusses a technique for destaticizing a mold by selectively supplying ions having the opposite polarity to the charge polarity of the mold in an imprint apparatus having a discharge electrode disposed at a position facing a space that is faced by the pattern surface of the mold.

SUMMARY OF THE INVENTION

According to an aspect of the present disclosure, an imprint apparatus for forming a pattern of an imprint material on a substrate by using a mold includes a substrate holding unit configured to hold the substrate, and a charging unit configured to charge at least either one of a surface of the substrate holding unit on a side facing the mold or a particle in a vicinity of the surface to the same polarity as a charge polarity of the mold.

Further features of the present disclosure will become apparent from the following description of exemplary embodiments with reference to the attached drawings.

BRIEF DESCRIPTION OF THE DRAWINGS

FIG. 7 is a diagram illustrating a configuration of an ion supply unit according to a third exemplary embodiment.

DESCRIPTION OF THE EMBODIMENTS

<Configuration of Imprint Apparatus>

Figure 1:
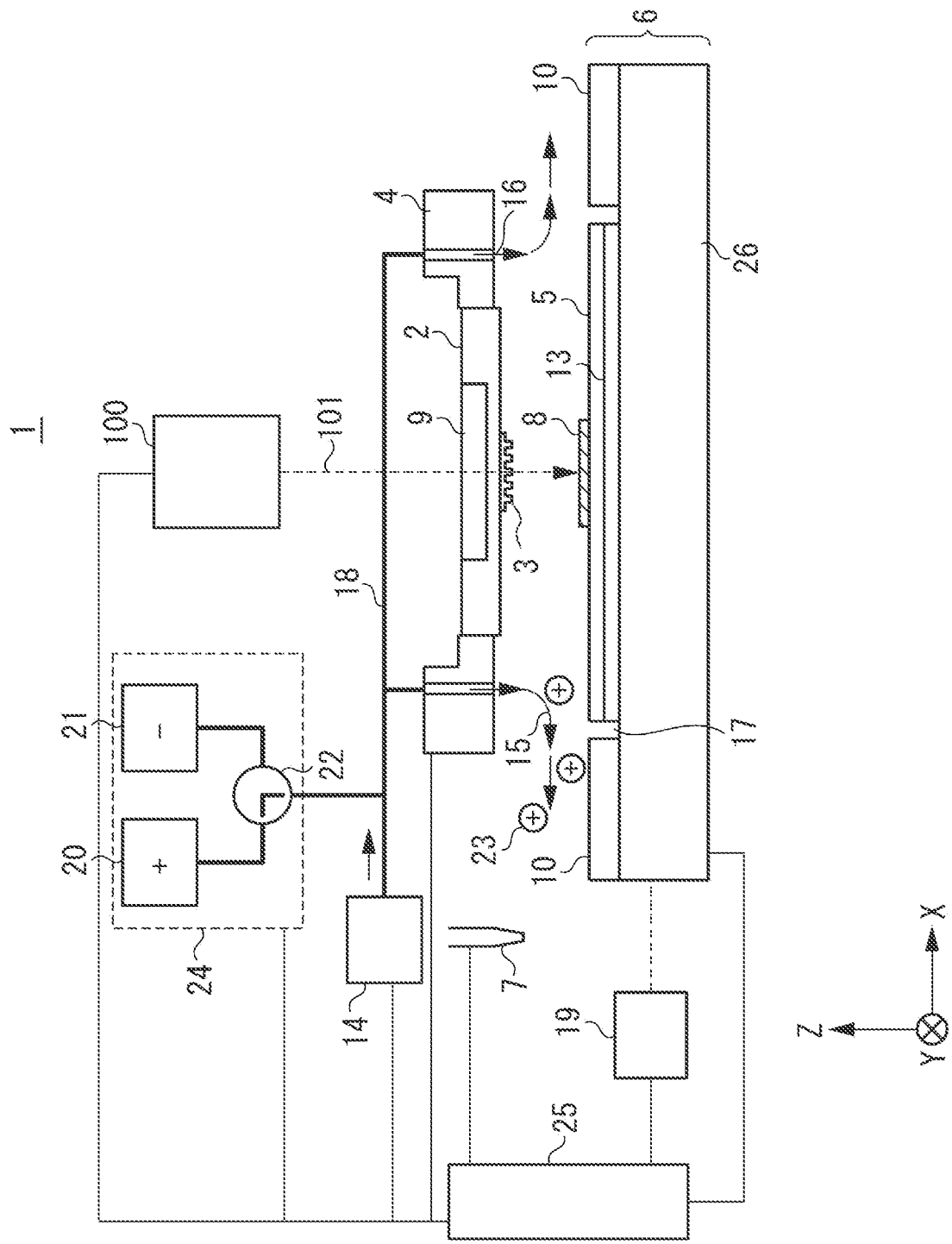
FIG. 1 is a diagram illustrating a configuration of an imprint apparatus according to a first exemplary embodiment.

FIG. 1 is a diagram illustrating a configuration of an imprint apparatus 1 according to a first exemplary embodiment. The imprint apparatus 1 forms a pattern of an imprint material 8 on a substrate 5 through contact and separation between the imprint material 8 on the substrate and a mold 2. Although, in the present exemplary embodiment, a light curing method is employed as a method for curing the imprint material 8 during contact between the imprint material 8 and the mold 2, the curing method is not limited thereto. In the following descriptions, the Z axis is parallel to the optical axis of an illumination system 100 and height direction, and the X and Y axes perpendicularly intersect with each other on a plane perpendicular to the Z axis.

The illumination system 100 irradiates the imprint material 8 with ultraviolet (UV)-rays 101 for curing. The mold 2 has a quadrangular outer peripheral shape. The surface of the mold 2 facing the substrate 5 includes a pattern portion 3 on which a pattern is formed in a three-dimensional form. A pattern, such as a circuit pattern, to be transferred onto the imprint material 8 is formed on the pattern portion 3.

The mold 2 is made of a material through which light for curing the imprint material 8 can penetrate. For example, the mold 2 may be made of glass such as quartz glass, silicate glass, calcium fluoride, magnesium fluoride, and acrylic glass. The mold 2 may also be made of such a material as sapphire, gallium nitride, polycarbonate, polystyrene, acrylics, and polypropylene. Alternatively, the mold 2 may be made of laminated layers of these materials. The mold 2 may have a concave portion 9 for easy deformation in the Z-axis direction by pressurization or depressurization.

A mold holding unit 4 is a holding member for holding the mold 2. The mold holding unit 4 holds the mold 2 by attracting the outer peripheral region of the concave portion 9 by using vacuum suction force, electrostatic force, or a mechanical means. The mold holding unit 4 moves the mold 2 mainly along the Z-axis direction so that contact (mold pressing) or separation (mold releasing) between the imprint material 8 and the mold 2 is performed. As an actuator of the drive mechanism of the mold holding unit 4, for example, a linear motor or an air cylinder may be employed.

The drive mechanism of the mold holding unit 4 may be composed of a plurality of drive systems such as a coarse motion drive system and a fine motion drive system. Using a plurality of drive systems ensures high-precision positioning of the mold 2. The mold holding unit 4 may include a position adjustment function not only in the Z-axis direction but also in the X- and Y-axis directions or in the θ direction (rotating mechanism), and a tilting function for correcting the inclination of the mold 2.

A stage 6 is a substrate holding member for holding the substrate 5. A portion 13 of the stage 6 attracts the substrate 5 to hold it. For example, at the portion 13, the stage 6 attracts the substrate 5 by using vacuum suction force or electrostatic force to hold the substrate 5. Alternatively, at the portion 13, a mechanical means may hold the substrate 5 so that the position of the substrate 5 is not shifted with respect to the stage 6.

The stage 6 is also a moving member for moving the substrate 5 and has a drive mechanism (not illustrated) for moving the substrate 5 in 6-axis directions. Based on a measurement result of the position of the stage 6 by a measurement unit 19, such as an interferometer, the stage 6 moves the substrate 5 to a target position according to an instruction of a control unit 25. As an actuator of the drive mechanism of the stage 6, for example, a linear motor or a planar motor may be employed.

The drive mechanism of the stage 6 may include a plurality of drive systems such as a coarse motion drive system and a fine motion drive system. Using a plurality of drive systems ensures high-precision positioning of the substrate 5. The contact and separation operations between the imprint material 8 and the mold 2 may be performed by moving at least one of the mold holding unit 4 and the stage 6 in the Z-axis direction.

The stage 6 has a surface facing the mold 2. The surface of the stage 6 facing the mold 2 includes at least a surface of the outer peripheral portion of the stage 6 around the disposed portion of the substrate 5. According to the present exemplary embodiment, the surface of the stage 6 facing the mold 2 is a surface of the stage 6 of the +Z direction side. This surface may include the upper surface of a plate member 10 or may be the upper surface of a portion 17 where the plate member 10 is not disposed.

A disposed portion of the substrate 5 is, for example, a portion 13.

The plate member 10 according to the present exemplary embodiment is disposed so as to surround the outer periphery of the disposed portion of the substrate 5. The plate member (flat plate) 10 may not be disposed so as to surround the disposed portion of the substrate 5 but may be disposed so as to face at least a part of the outer periphery of the disposed portion of the substrate 5 when viewed from a direction perpendicular to the direction along the surface of the substrate 5.

Although the height of the plate member 10 can be arbitrarily selected, it is desirable that the side surface of the plate member 10 can face the outer periphery of the substrate 5. In particular, it is desirable that the height of the surface of the plate member 10 on the side facing the mold 2 is approximately the same as the height of the surface of the substrate 5 held on the stage 6, on the side facing the mold 2. For example, it is desirable that the difference in height between the substrate 5 and the plate member 10 is 1 mm or smaller. The plate member 10 according to the present exemplary embodiment is made of an insulating material. In particular, it is desirable to use a ceramic such as alumina having a high wear resistance and a high chemical stability.

The plate member 10 has a role of reducing the difference in height between the outer peripheral portion of the substrate 5 and a top plate 26. In the contact operation between the imprint material 8 and the mold 2 when forming a pattern in the region at the end portion of the substrate 5, stress concentrates on the end portion of the substrate 5 possibly resulting in defects in the formed pattern. The plate member 10 is disposed to reduce defects from occurring.

A supply unit 7 supplies the imprint material 8 on the substrate 5.

The imprint apparatus 1 includes a gas supply unit for blowing off a gas to the imprint space. In the present exemplary embodiment, the imprint space refers to a space between the mold holding unit 4 and the mold 2 and the stage 6 in a state where the mold 2 and the stage 6 face each other. The gas supply unit includes a gas supply source 14 for supplying gas, a gas supply opening 16 for blowing off gas 15 from the gas supply source 14, and a path 18 for connecting the gas supply source 14 and the gas supply opening 16.

The gas supply unit blows off the gas 15 from the gas supply opening 16 disposed at the outer peripheral portion of the mold holding unit 4. It is desirable that the gas supply opening 16 has such a circular shape that surrounds the periphery of the mold 2. Alternatively, the gas supply opening 16 may be formed of a plurality of gas supply openings circularly arranged. The gas 15 is not limited to air, and may be an inactive gas such as helium and nitrogen.

An ion supply unit (charging unit) 24 supplies ions having the same polarity as the charge polarity of the mold 2 toward at least the surface of the outer peripheral portion of the disposed portion of the substrate 5. In this way, the ion supply unit 34 charges at least one of the surface of the stage 6 facing the mold 2 and particles existing in the vicinity of the surface to the same polarity as the charge polarity of the mold 2. Particles in the vicinity of the surface refer to particles adhering to the surface of the stage 6 facing the mold 2 and particles existing at a distance of 0.2 mm or below from the surface.

In the following descriptions, the charge polarity of the mold 2 refers to the polarity of charges to which the mold 2 is charged. The ion supply unit 24 according to the present exemplary embodiment includes at least a generator 20 for generating positive ions, a generator 21 for generating negative ions, and a switching unit (adjustment unit) 22. The generators 20 and 21 are ion generators of corona discharge type. The generator 21 applies a negative voltage to a needle-shaped electrode (not illustrated) to discharge negative ions. The generator 20 applies a positive voltage to a needle-shaped electrode (not illustrated) to discharge positive ions.

The switching unit 22 switches the polarity of ions to be supplied based on a measurement result (detection result) of an electrometer 12 (described below). Ions having the polarity selected by the switching unit 22 are discharged to the path 18. The discharged ions pass through the inside of the path 18 together with the gas 15. In this way, the ion supply unit 24 supplies ions having the same polarity as the polarity of the mold 2, together with the gas 15, from the gas supply opening 16 toward the surface of the stage 6 facing the mold 2.

It is desirable that, as with the present exemplary embodiment, the ion supply unit 24 supplies ions from a position that can face the stage 6. Ions can be efficiently supplied to the plate member 10 and particles on the plate member 10.

Although the ion supply unit 24 may be provided with a dedicated ion supply opening (not illustrated), it is more desirable that the gas supply opening 16 serves also as an ion supply opening. This enables reducing an installation space compared with a case where a dedicated ion supply opening and a dedicated ion path are disposed. The ion supply unit 24 does not necessarily need to supply either positive or negative ions. Both positive and negative ions can be supplied and their ratio is adjusted by controlling the switching unit 22.

Figure 2:
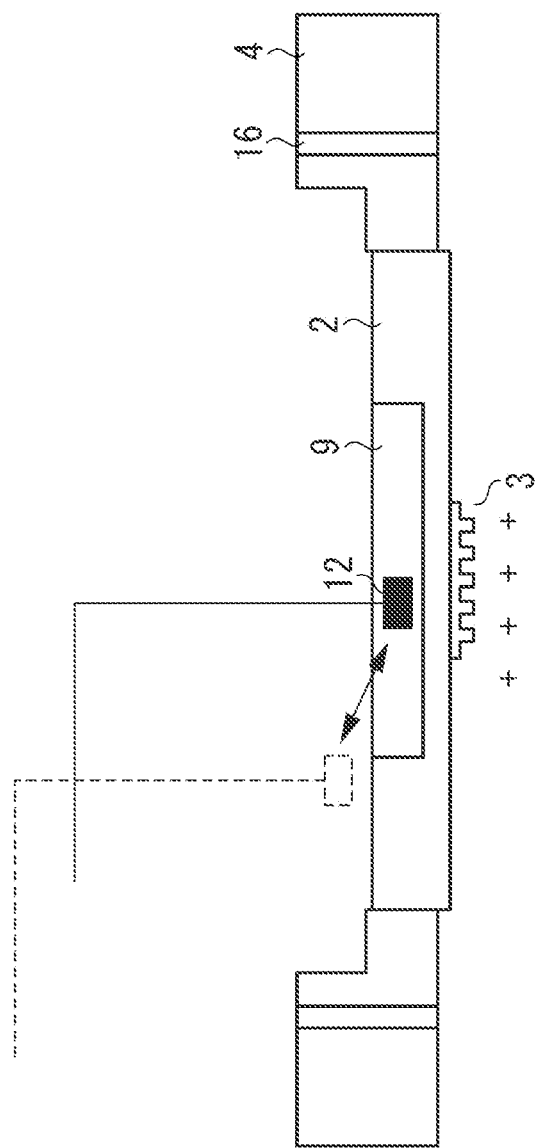
FIG. 2 is a diagram illustrating an arrangement of an electrometer disposed above a mold.

As a detection method for detecting the charge polarity of the mold 2, the imprint apparatus 1 includes the electrometer 12. FIG. 2 illustrates an arrangement of the electrometer 12 disposed above the mold 2. The electrometer 12 measures the potential of the mold 2 with respect to a reference potential. The electrometer 12 measures a potential in a state (solid lines) where it is disposed in the concave portion 9. As the reference potential, for example, the potential at any one portion on the stage 6 may be used. Based on the potential of the mold 2, the electrometer 12 outputs the charge polarity of the mold 2 to the control unit 25 (described below).

The electrometer 12 is movable and moves to a position (dashed lines) evacuated from the concave portion 9 at least while the illumination system 100 is emitting the UV-rays 101. Even in a case where the mold 2 is charged in reverse order of the triboelectric series because of differences in the contact surface state and the existence or absence of impurities between the pattern portion 3 and the imprint material 8, measuring the potential by using the electrometer 12 in this way ensures the measurement of the polarity of charges to which the mold 2 is charged.

Figure 3:
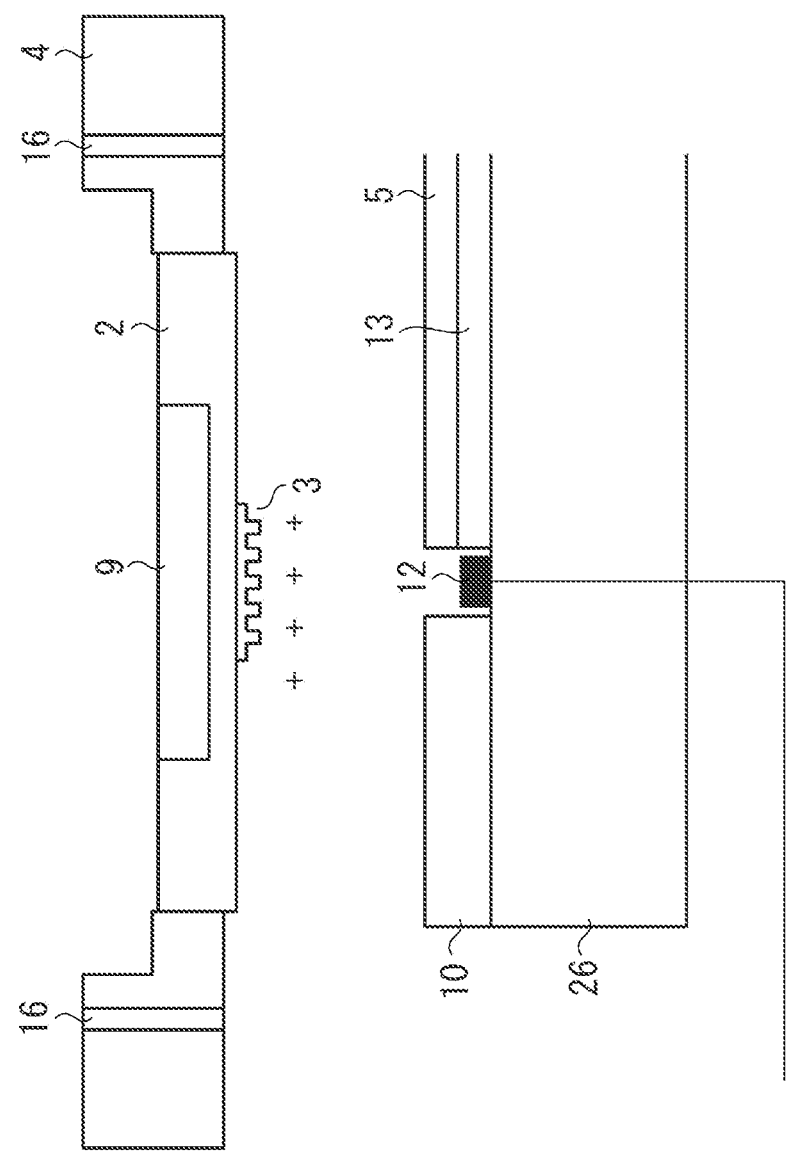
FIG. 3 is a diagram illustrating an arrangement of an electrometer disposed on a stage.

FIG. 3 is a diagram illustrating an arrangement of the electrometer 12 disposed on the stage 6. When the stage 6 positions the electrometer 12 at a position facing the mold 2 at a predetermined timing, the electrometer 12 measures the potential. The predetermined timing may be, for example, each time a pattern is formed in the one shot region, each time a pattern is formed on one substrate, each time a pattern is formed on a predetermined number of substrates (for example, substrates of one lot), and at predetermined time intervals.

Referring back to FIG. 1, the control unit 25 is wiredly or wirelessly connected with the illumination system 100, the mold holding unit 4, the stage 6, the electrometer 12, the gas supply source 14, the measurement unit 19, and the ion supply unit 24. The control unit 25 includes a central processing unit (CPU) and memories such as a read only memory (ROM) and a random access memory (RAM) (not illustrated).

Figure 4:
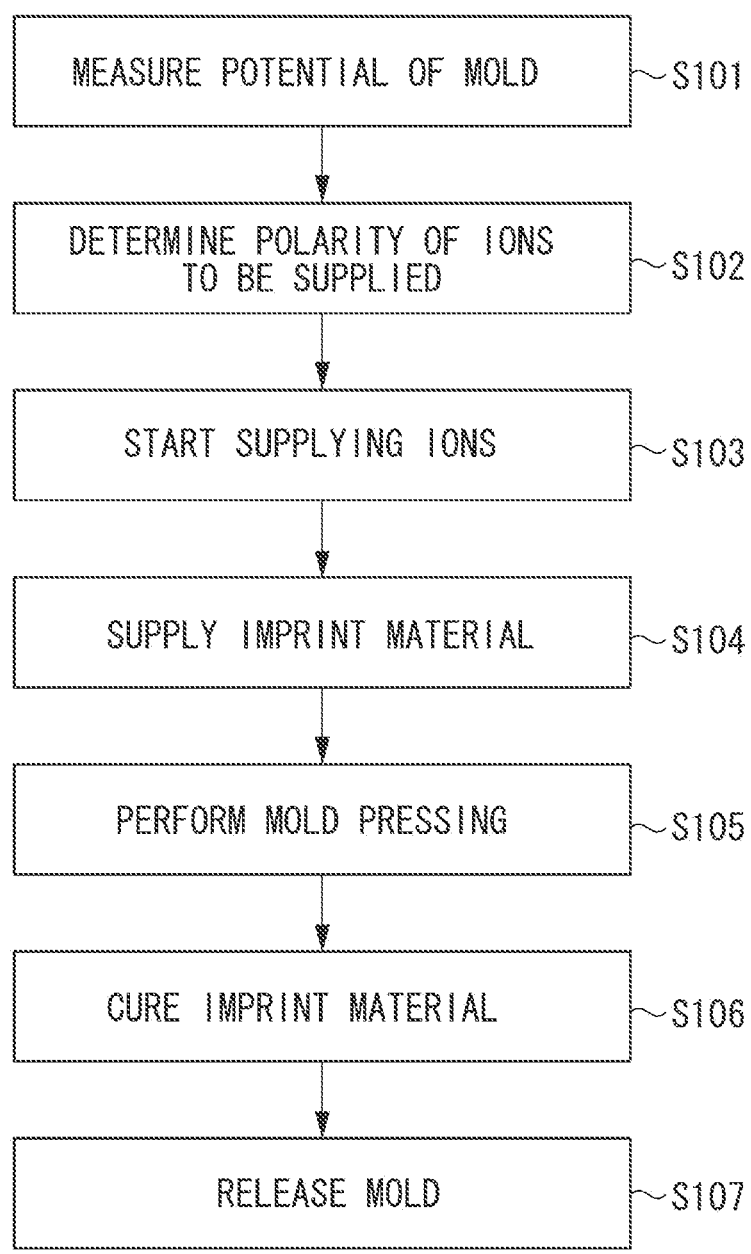
FIG. 4 is a flowchart illustrating an imprinting method.

The memories included in the control unit 25 store, for example, programs indicated by the flowchart illustrated in FIG. 4 and information about the polarity of ions to be supplied toward the plate member 10. The control unit 25 performs imprint processing by controlling each component connected to the control unit 25 according to a program stored in the memories. As long as the control unit 25 is provided with functions to be performed by the control unit 25, the control unit 25 may be configured of a set of separate control boards or a single control board.

<Imprinting Method>

FIG. 4 illustrates an imprinting method, i.e., a flowchart illustrating a flow of imprint processing. FIG. 4 illustrates an imprinting method in a case where the potential of the mold 2 is measured each time a pattern is formed on one shot region. In step S101, the control unit 25 moves the electrometer 12 to the concave portion 9 and measures the potential of the mold 2. In step S102, the electrometer 12 outputs a measurement result to the control unit 25, and, based on the measurement result, the control unit 25 determines the polarity of ions to be supplied from the ion supply unit 24.

In step S102, when the pattern portion 3 of the mold 2 is positively charged, the control unit 25 instructs the ion supply unit 24 to supply positive ions. On the other hand, when the pattern portion 3 of the mold 2 is negatively charged, the control unit 25 instructs the ion supply unit 24 to supply negative ions. When ions having the opposite polarity to the charge polarity of the mold 2 are included, the ion supply unit 24 supplies ions so that ions having the same polarity as the charge polarity of the mold 2 provide a larger total amount of charges included in the gas 15 per unit volume to be blown off from the gas supply opening 16 than ions having the opposite polarity to the charge polarity of the mold 2.

In step S103, the ion supply unit 24 controls the switching unit 22 to start supplying the ions determined by the control unit 25 in step S102 toward the surface of the peripheral portion of the disposed portion of the substrate 5. While the ion supply unit 24 is supplying ions, the control unit 25 controls the supply unit 7, the illumination system 100, the mold holding unit 4, the stage 6, and the measurement unit 19 to form a pattern on the substrate 5.

The pattern forming process includes at least the processes in steps S104 to S107. In step S104, the supply unit 7 performs a supply process for supplying the imprint material 8 to the substrate 5. In step S105, the mold holding unit 4 performs a mold pressing process for making the imprint material 8 and the mold 2 in contact with each other. In step S106, the illumination system 100 performs a curing process for curing the imprint material 8. In step S107, the mold holding unit 4 performs a mold releasing process for separating the mold 2 from the imprint material 8. After pattern formation, the control unit 25 repeats steps S101 to S107. It is also possible to adjust the polarity of ions to be supplied and the amount of charges according to the absolute value of the potential of the mold 2 measured in step S101.

<Actions and Effects by Ion Supply Having the Same Polarity as Mold>

Actions and effects by the imprint apparatus 1 and the above-described imprinting method will be described below with reference to FIGS. 5A and 5B. Although the pattern portion 3 may possibly be positively and negatively charged by the mold releasing operation, the following example will be described centering on a case where the pattern portion 3 is positively charged.

Figure 5A:
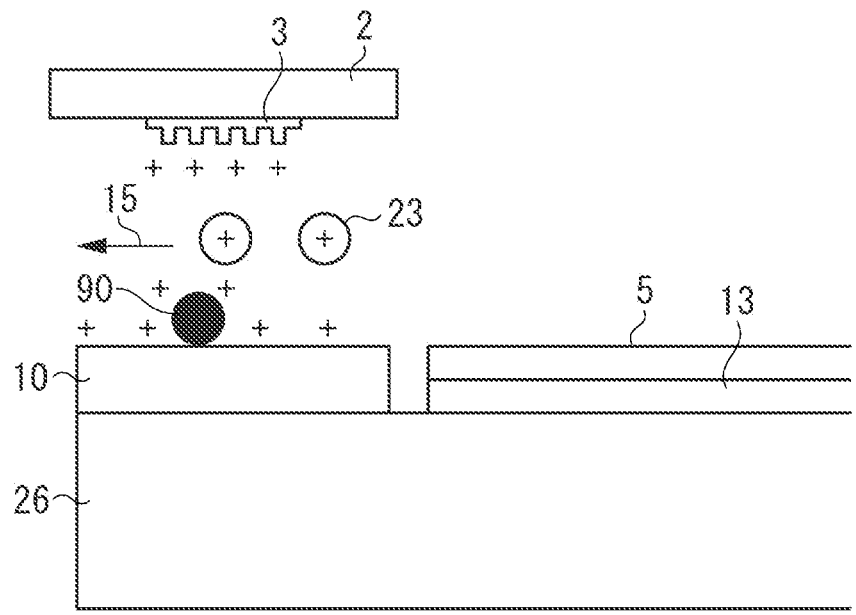
FIGS. 5A and 5B are respectively first and second diagrams illustrating an action by ion supply according to the first exemplary embodiment.
Figure 5B:
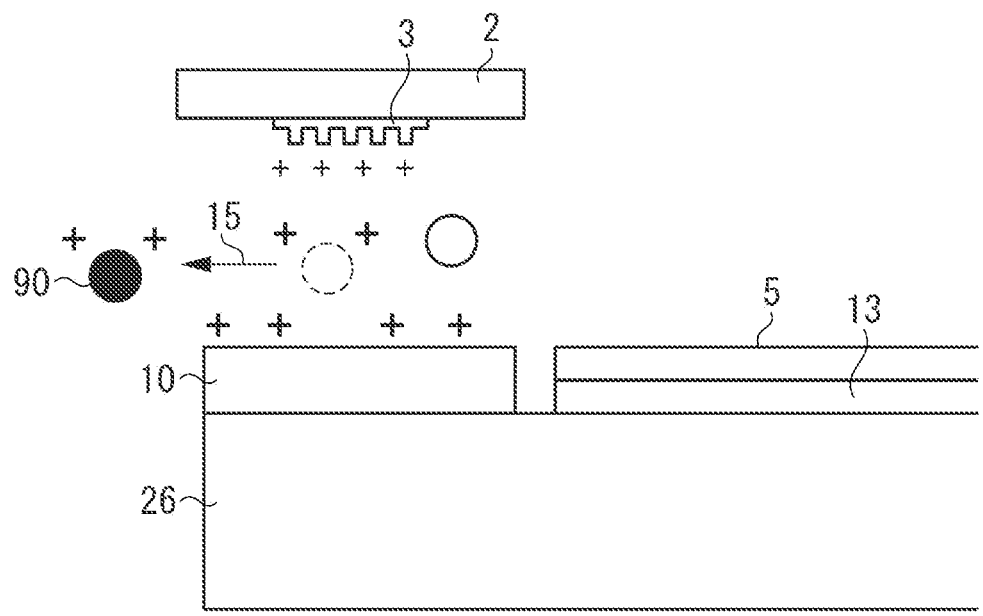

FIGS. 5A and 5B illustrate states of a particle that has reached on the upper surface of the plate member 10. In this case, intermolecular force is acting between the plate member 10 and the particle 90. As illustrated in FIG. 5A, when the ion supply unit 24 supplies positive ions 23 to the plate member 10, the particle 90 and the plate member 10 start being positively charged regardless of the polarity of the particle 90 before supplying the positive ions 23. More specifically, the particle 90 and the plate member 10 are charged to the same polarity as the polarity of the mold 2. As charging progresses, repulsive force due to Coulomb force acts between the particle 90 and the plate member 10 more strongly than intermolecular force. As illustrated in FIG. 5B, the particle 90 separates from the plate member 10 and starts floating.

The particle 90 floats while being positively charged. Since the particle 90 also receives repulsive force from the pattern portion 3 charged to the same polarity, the particle 90 hardly adheres to the pattern portion 3. Therefore, the particle 90 is carried by the gas 15 supplied from the gas supply opening 16 to the imprint space, and is discharged to the outside of the imprint space. The particle 90 discharged to the outside of the imprint space is discharged by an air conditioning device disposed in the imprint apparatus 1 to the outside thereof. If a gas exhaust port (not illustrated) for discharging gas inside the gas supply opening 16 is disposed, the particle 90 is discharged to the outside of the imprint apparatus 1 through the gas exhaust port.

In this way, the ion supply unit 24 charges the surface of the plate member 10 facing the mold 2 and the particle 90 on the surface to the same polarity as the charge polarity of the mold 2. This enables reducing the possibility that the particle 90 adheres to the mold 2 and enables preventing or reducing the possibility that the particle 90 is sandwiched between the mold 2 and the substrate 5. Accordingly, it becomes possible to reduce defects of the formed pattern and reduce the degradation of the yield of articles manufactured by using the imprinting method according to the present exemplary embodiment.

According to the present exemplary embodiment, even if the particle 90 is a conductive or insulating material, similar effects can be obtained because of above-described action. When the substrate 5 is an insulating material such as a Si wafer, ions having the same polarity as the mold 2 are supplied also on the substrate 5, enabling reducing the possibility that the particle 90 adhering to the substrate 5 adheres to the mold 2.

The ion supply unit 24 may be disposed on the stage 6. If the ion supply unit 24 for supplying ions having the same polarity as the charge polarity of the mold 2 is disposed on the stage 6, it is possible to constantly supply ions having the same polarity as the charge polarity of the mold 2 to the surface of the stage 6 facing the mold 2 and the particle 90 on the surface. Therefore, the particle 90 moving from the stage 6 to the mold 2 and adhering thereto can be sufficiently reduced compared with a case where, unlike the present exemplary embodiment, ions having the opposite polarity to the polarity of the mold 2 are supplied and the mold 2 is destaticized in a short time during which the mold 2 and the stage 6 face each other.

Figure 6A:
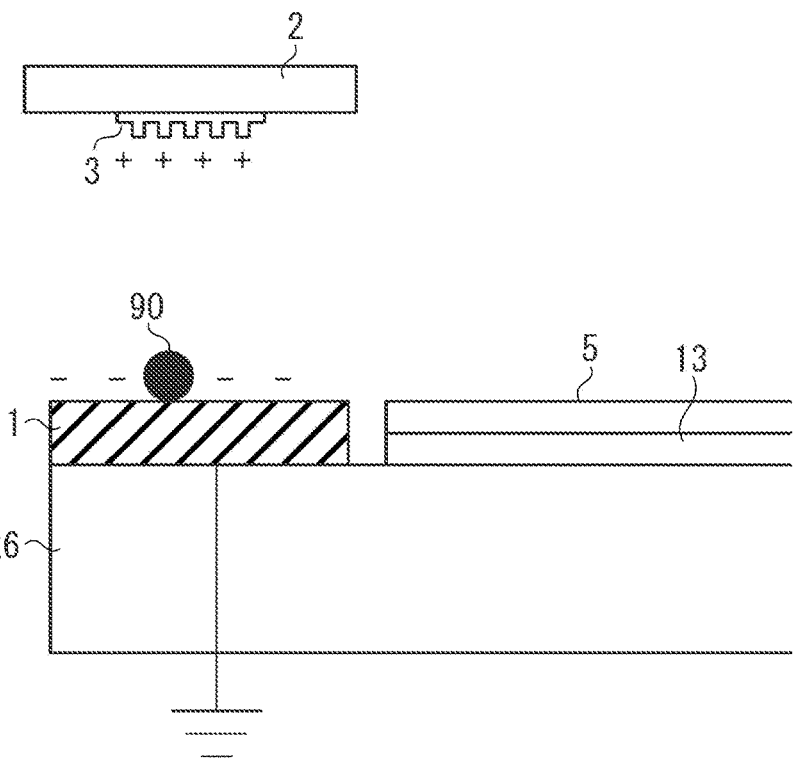
FIGS. 6A and 6B are respectively first and second diagrams illustrating a part of a configuration of an imprint apparatus according to a second exemplary embodiment.
Figure 6B:
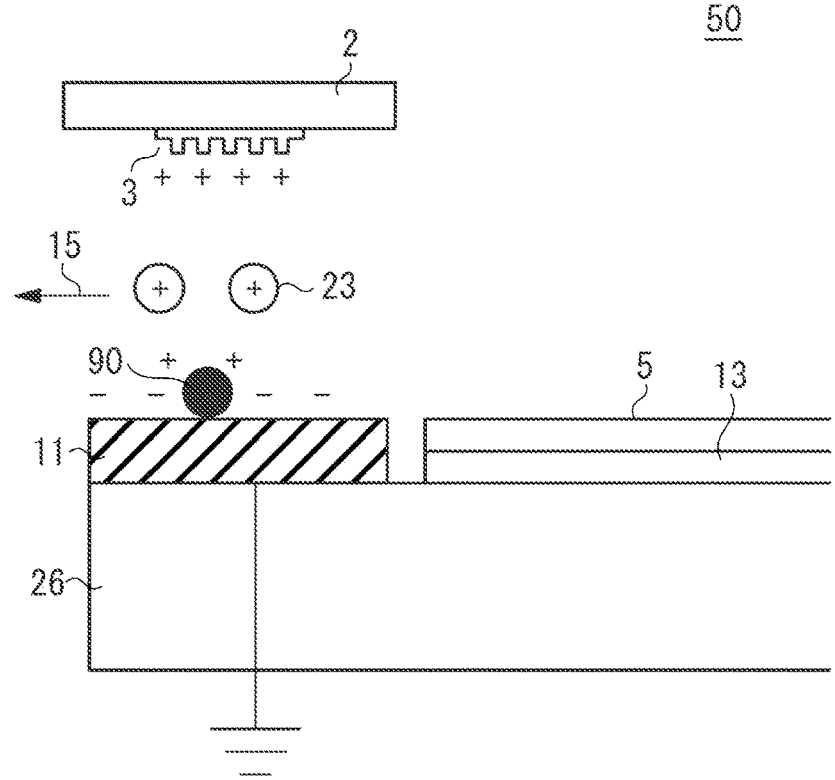

FIGS. 6A and 6B are diagrams illustrating a part of a configuration of an imprint apparatus 50 according to a second exemplary embodiment. The imprint apparatus 50 uses an electrically grounded conductive plate member 11, instead of the insulating plate member 10. Similar to the first exemplary embodiment, the second exemplary embodiment will be described below centering on a case where the pattern portion 3 is positively charged. The particle 90 is an insulating material in the present exemplary embodiment.

FIG. 6A illustrates a state before positive ions 23 are supplied. In a state where the positively charged mold 2 comes near the conductive plate member 11, the surface of the plate member 11 is negatively charged by electrostatic induction. FIG. 6B illustrates a state where the positive ions 23 are supplied.

When the ion supply unit 24 supplies the positive ions 23, the particle 90 is positively charged regardless of the polarity of the particle 90 before the positive ions 23 are supplied. On the other hand, since the plate member 11 has conductivity and the positive ions 23 in contact with the plate member 11 flow into a grounding terminal as a current, the plate member 11 remains at the negative potential. Thus, an attracting force due to Coulomb force acts between the particle 90 and the plate member 11 and an attraction force due to Coulomb force acts between the particle 90 and the mold 2 result in a state where the particle 90 strongly adheres to the plate member 11.

If the particle 90 is a conductive metallic material, negative charges are induced on the surface of the particle 90 by electrostatic induction in a state where the positively charged pattern portion 3 comes near the conductive plate member 11. Although the particle 90 starts separating from the plate member 11 by the attraction force due to Coulomb force from the mold 2, the particle 90 having once started separating from the plate member 11 is positively recharged by the positive ions 23, and the particle 90 adheres to the plate member 11 by the attraction force from the plate member 11.

In this way, when the particle 90 is a conductive or an insulating particle, the particle 90 in the vicinity of the surface of the plate member 11 on facing the mold 2 is charged to the same polarity as the charge polarity of the mold 2. This enables reducing the possibility that the particle 90 adheres to the mold 2 and enables preventing or reducing the possibility that the particle 90 is sandwiched between the mold 2 and the substrate 5. Accordingly, it becomes possible to reduce defects of the formed pattern and reduce the degradation of the yield of a article manufactured by using the imprinting method according to the present exemplary embodiment.

An imprinting method according to the second exemplary embodiment may include a cleaning process for removing at a predetermined timing the particle 90 accumulated on the plate member 11 or a process for replacing the plate member 11 at a predetermined timing.

In a third exemplary embodiment, instead of the ion supply unit 24 of corona discharge type, the ion supply unit 30 of ionizing radiation type is used as a charging unit. FIG. 7 is a diagram illustrating a configuration of the ion supply unit 30. The ion supply unit 30 includes an air blowing unit 31, a soft X-ray source 34, a power source 38, a switching unit 39, and an electrode 40.

The air blowing unit 31 takes in air 32 from the outside and sends the air 32 into a housing 33. The soft X-ray source 34 emits soft X-rays 35 to the inside of the housing 33. When the housing 33 is irradiated with the soft X-rays 35, the air 32 in the housing 33 is ionized to the positive ions 23 and the negative ions 39. The ion supply unit 30 can adjust the polarity of the ions to be supplied to the space faced by the surface of the stage 6 facing the mold 2, by using the power source 38 and the switching unit 39.

When the switching unit 39 switches the connection to the power source 38, a positive or negative potential can be applied to the electrode 40. The electrode 40 is, for example, mesh-shaped having a plurality of small openings. For example, if a positive potential is applied to the electrode 40, the negative ions 39 are captured by the electrode 40 and only the positive ions 23 that have passed the mesh are supplied to the path 18.

The strength of the electrode 40 for attracting the negative ions 39 can be changed by changing the magnitude of the voltage applied by the power source 38, making it possible to adjust the ratio of the polarity of ions to be supplied to the space faced by the surface of the stage 6 facing the mold 2.

Also when the ion supply unit 30 is used, similar effects to those in the first and the second exemplary embodiments can be obtained. The ion supply unit 30 may use a radiation source such as an α-ray source and a UV-ray source instead of the soft X-ray source 34.

Other Embodiments

The surface of the stage 6 facing the substrate 5 may be charged to the same polarity as the charge polarity of the mold 2 by using a potential control unit such as a voltage source as a charging unit. This method enables capturing at least a part of particles that easily adhere to the mold 2 and reducing the number of the particles adhering to the mold 2. This enables preventing or reducing the possibility that the particle 90 is sandwiched between the mold 2 and the substrate 5.

In the above-described exemplary embodiments, the charging unit may function as an ionizer for destaticizing the mold 2 or as the ion supply unit 34 depending on the charging state of the mold 2. The detection unit for detecting the charge polarity of the mold 2 is not limited to potential measurement, and may evaluate the charge polarity of the mold 2, for example, based on a result of measurement of charges and electric field. The detection unit may measure the amount of charge together with the charge polarity.

In the above-described imprinting method, it is not necessary to measure the potential of the mold 2 by using the electrometer 12 in the imprint apparatus 1. For example, each time a pattern is formed on a predetermined number of substrates 5, the mold 2 may be carried out to the outside of the imprint apparatus 1 and the control unit may acquire the polarity of charges of the mold 2 measured at the carrying-out destination. In this case, the control unit 25 controls the ion supply unit 24 or 34 so as to supply a larger amount of ions having the same polarity as the acquired polarity of charges to which the mold 2 is charged than the amount of ions having the opposite polarity thereto.

When the materials of the pattern portion 3 and the imprint material 8 are sufficiently separated from each other in the triboelectric series, when it is obvious which of the positive and negative polarities to which the mold 2 is easily chargeable, and when the polarity of the mold 2 is easily stabilized, the imprint apparatus 1 does not need to have the electrometer 12. In this case, the control unit 25 may acquire in advance the polarity of charges to which the mold 2 is easily chargeable, based on the relation between the materials of the mold 2 and the imprint material 8. Then, the control unit 25 may control the ion supply unit 24 to supply ions having the same polarity as the polarity to which the mold 2 is easily chargeable.

For example, compared with quartz, which is likely to be used as the mold 2, a material ranked lower in the triboelectric series than quartz is likely to be used as the imprint material 8 in many cases. In this case, since the pattern portion 3 is positively chargeable, the ion supply unit 24 or 34 is used.

In the present specification, a "particle" refers to a material not intended to be involved in pattern formation. Particles include, for example, a dry solid material produced from the imprint material 8 discharged by the supply unit 7 and floated as mist, microparticles arising from components of the imprint apparatus 1, and dust entered into the imprint apparatus 1 from the outside space and existing therein.

A curable composition (sometimes also referred to as an uncured state resin) to be cured when energy for curing it is applied is used as the imprint material 8 to be used by the imprint apparatuses 1 and 50. Electromagnetic waves and heat are used as energy for curing. Electromagnetic waves include, for example, light such as infrared rays, visible light, and UV-rays selected from a wavelength range from 10 nm or above to 1 mm or below.

A curable composition may be a composition cured by irradiation of light as with the above-described exemplary embodiments or may be a composition cured by heating. A photo-curable composition cured by light may contain at least a polymerizable composition and a photo-polymerizable initiator, and may contain a non-polymerizable composition or a solvent as required. Non-polymerizable composition is at least one type selected from groups including sensitizers, hydrogen donors, internal mold release agents, interfacial active agents, antioxidants, and polymer components.

The imprint material 8 is applied onto the substrate 5 in the form of a film by a spin coater or a slit coater. Alternatively, the imprint material 8 may be applied onto the substrate 5 in the form of droplets, in the form of an island formed by a series of a plurality of droplets, or in the form of a film, by a liquid jet head. The viscosity (at 25 degrees) of the imprint material 8 is, for example, 1 mPa-s or above and 100 mPa-s or below.

<Article Manufacturing Method>

A cured material pattern formed on the substrate 5 by the imprint apparatus 1 according to the above-described exemplary embodiments is permanently used for at least a part of various types of articles or temporarily used when manufacturing various types of articles.

The substrate 5 may be made of, for example, glass, ceramic, metal, semiconductor, or resin. If necessary, a member made of a material different from the substrate 5 may be formed on the surface of the substrate 5. More specifically, the substrate 5 is made of, for example, a silicon wafer, a compound semiconductor wafer, or a silica glass.

Articles include, for example, electric circuit elements, optical elements, micro electro mechanical systems (MEMS), recording elements, sensors, and molds. Electric circuit elements include volatile or nonvolatile semiconductor memories such as a dynamic random access memory (DRAM), a static random access memory (SRAM), a flash memory, and a magnetoresistive random access memory (MRAM), and include semiconductor devices such as a large-scale integration (LSI), a charge-coupled device (CCD), an image sensor, and a field-programmable gate array (FPGA). Molds include a mold for imprinting (a mold on which a pattern is reproduced).

A cured material pattern is used as it is at least as a part of component members of the above-described articles or is temporarily used as a resist mask. The resist mask is removed after etching or ion implantation is performed in a substrate working process. The substrate working process may further include other known processing steps (development, oxidization, film formation, vapor deposition, flattening, resist separation, dicing, bonding, and packaging).

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-038130, filed Feb. 29, 2016, which is hereby incorporated by reference herein in its entirety.

What is claimed is:

1. An imprint apparatus for forming a pattern of an imprint material on a substrate by using a mold, the imprint apparatus comprising:
   a substrate holding unit, including a plate member at a position outside of, and surrounding, a disposed portion of the substrate, configured to hold the substrate;
   a charging unit configured to charge at least one of a surface of the plate member or a particle existing in a vicinity of the surface of the plate member; and
   a controller configured to acquire information about the charge polarity of the mold, determine a polarity of ions supplied by the charging unit as the same polarity as the charge polarity of the mold based on the acquired information, and control the operation of the charging unit such that the plate member or the particle is charged to the same polarity as the charge polarity of the mold based on the polarity of the ions being determined.

2. The imprint apparatus according to claim 1, further comprising a detection unit configured to detect a charge polarity of the mold,
   wherein, based on a detection result by the detection unit, the controller controls the operation of the charging unit such that the charging unit charges the at least one of the surface of the plate member or the particle existing in the vicinity of the surface of the plate member.

3. The imprint apparatus according to claim 1,
   wherein the charging unit is an ion supply unit configured to supply ions having the same polarity as the charge polarity of the mold toward the surface of the plate member.

4. The imprint apparatus according to claim 3, wherein, in a state where an ion supply opening of the ion supply unit for supplying ions having the same polarity as the charge polarity of the mold faces the plate member, the ion supply unit supplies ions having the same polarity.

5. The imprint apparatus according to claim 3, further comprising a gas supply unit including a gas supply opening disposed at an outer peripheral portion of a mold holding unit for holding the mold, and configured to supply gas from the gas supply opening,
wherein the ion supply unit supplies ions having the same polarity as the charge polarity of the mold, together with the gas, from the gas supply opening.

6. The imprint apparatus according to claim 1, wherein the charging unit is a potential control unit configured to control a potential of a peripheral portion of a disposed portion of the substrate.

7. The imprint apparatus according to claim 1,
wherein the plate member is an insulating plate member or a grounded conductive plate member, and
wherein the charging unit charges an upper surface of the plate member and the particle existing in the vicinity of the upper surface to the same polarity as the charge polarity of the mold.

8. The imprint apparatus according to claim 7, wherein the plate member is a flat plate of which a height of the upper surface is approximately equal to a height of a surface of the held substrate.

9. A method for manufacturing an article, comprising:
forming a pattern of a cured imprint material on a substrate by using an imprint apparatus; and
processing the substrate with a pattern formed thereon to manufacture the article,
wherein the imprint apparatus includes:
a substrate holding unit, including a plate member a plate member at a position outside of, and surrounding, a disposed portion of the substrate, configured to hold the substrate; and
a charging unit configured to charge at least one surface of the plate member and a particle existing in a vicinity of the surface of the plate member to the same polarity as a charge polarity of the mold.

10. The imprint apparatus according to claim 1,
wherein the controller controls the operation of the charging unit such that the charging unit charges the particle positively in a case where the charge polarity of the mold is positive.

11. The imprint apparatus according to claim 1,
wherein the controller controls the operation of the charging unit such that the charging unit charges the particle negatively in a case where the charge polarity of the mold is negative.

12. An apparatus for forming a surface-shaped cured product according to a contact surface of a component by curing a moldable material in a state of the moldable material and the component are in contact state, the apparatus comprising:
a substrate holding unit, including a plate member a plate member at a position outside of, and surrounding, a disposed portion of the substrate, configured to hold the substrate;
a charging unit configured to charge at least one of a surface of the plate member or a particle existing in a vicinity of the surface of the plate member; and
a controller configured to acquire information about the charge polarity of the component, determine a polarity of ions supplied by the charging unit as the same polarity as the charge polarity of the component based on the acquired information, and control the operation of the charging unit such that the plate member or the particle is charged to the same polarity as the charge polarity of the component based on the polarity of the ions being determined.

* * * * *